(12) United States Patent
Matsusaka

(10) Patent No.: US 7,120,204 B2
(45) Date of Patent: Oct. 10, 2006

(54) WAVEFORM GENERATOR OPERABLE IN ACCORDANCE WITH A PLURALITY OF BAND LIMITATION CHARACTERISTICS

(75) Inventor: Hiromi Matsusaka, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 927 days.

(21) Appl. No.: 10/012,325

(22) Filed: Dec. 12, 2001

(65) Prior Publication Data

US 2002/0090036 A1    Jul. 11, 2002

(30) Foreign Application Priority Data

Jan. 10, 2001  (JP)  ............ P. 2001-002676

(51) Int. Cl.
  *H03C 3/00* (2006.01)
  *H04L 27/20* (2006.01)
(52) U.S. Cl. ............... 375/302; 375/308; 332/103
(58) Field of Classification Search ............ 375/237, 375/240, 212, 213, 200, 261, 271, 279, 280, 375/281, 302, 308; 332/103, 145
  See application file for complete search history.

(56) References Cited

U.S. PATENT DOCUMENTS

| | | | | |
|---|---|---|---|---|
| 4,338,674 A | * | 7/1982 | Hamada | ............ 708/272 |
| 5,313,494 A | | 5/1994 | Park et al. | |
| 5,379,242 A | | 1/1995 | Rose et al. | |
| 5,426,704 A | * | 6/1995 | Tamamura et al. | ...... 381/71.9 |
| 5,495,504 A | * | 2/1996 | Yasuda | ............ 375/281 |
| 5,590,155 A | * | 12/1996 | Yasuda | ............ 375/261 |
| 5,757,858 A | * | 5/1998 | Black et al. | ............ 375/295 |
| 5,825,805 A | * | 10/1998 | Kato | ............ 375/130 |
| 5,990,755 A | * | 11/1999 | Takaaki | ............ 332/103 |
| 6,031,431 A | * | 2/2000 | Vinekar | ............ 332/103 |
| 6,243,422 B1 | * | 6/2001 | Urabe et al. | ............ 375/259 |
| 6,628,727 B1 | * | 9/2003 | Wu et al. | ............ 375/308 |
| 2003/0118081 A1 | * | 6/2003 | Philips et al. | ............ 375/130 |

FOREIGN PATENT DOCUMENTS

| | | |
|---|---|---|
| EP | 0 494 696 A2 | 7/1992 |
| GB | 2 032 722 A | 5/1980 |
| JP | 6-26336 | 4/1994 |
| JP | 7-264258 | 10/1995 |
| JP | 9-153919 | 6/1997 |

* cited by examiner

*Primary Examiner*—Betsy L. Deppe
(74) *Attorney, Agent, or Firm*—McDermott Will & Emery LLP

(57) ABSTRACT

A waveform generator comprises waveform generating means for generating a waveform signal band-limited using a first band limitation characteristic in accordance with the input signal series, memory means for storing in advance a difference signal between a waveform signal band-limited using the first band limitation characteristic for the input signal series and a waveform signal band-limited using a second band limitation characteristic for the input signal series and outputting the difference signal in accordance with the input signal series, adding means for adding a waveform signal from the waveform generating means to a difference signal from the memory means and outputting the signal band-limited using the second band limitation characteristic, and selector switch means for selectively outputting either a waveform signal from the waveform generating means or a waveform signal from the adding means.

1 Claim, 11 Drawing Sheets

WAVEFORM GENERATOR OPERABLE IN ACCORDANCE WITH A PLURALITY OF BAND LIMITATION CHARACTERISTICS

BACKGROUND OF THE INVENTION

The present invention relates to a waveform generator provided in a mobile communications terminal operable in accordance with a plurality of band limitation characteristics in a modulator for modulating a digital signal.

In recent years, while communications and broadcasts is going digital, the digital modulation technology is essential to correctly transmitting more information. With the advancement of the LSI (Large Scale Integration) technology, features and systems implemented on a plurality of chips in the related art tend to be integrated on a single chip. Under such situations, a shared terminal is in need that supports a plurality of communications systems via a single terminal in the field of mobile communications. While the characteristics of a band limitation filter generally essential to a modulator are specified by the standards of each communications system, such characteristics differ from each other so that it is necessary to provide a waveform generator having a plurality of band limitation characteristics in a shared terminal.

In transmitting a digital signal in a limited band, a roll-off filter is used to prevent interference between digital signals (intersymbol interference) caused by the band limitation filter. A case where band limitation characteristics are different includes a case where the roll-off ratio to determine cut-off characteristics is different or a case where the characteristic function itself is different, such as a Nyquist filter and a route Nyquist filter. FIG. 2A shows the impulse response waveforms (for ±3 symbol cycles) of Nyquist filters with roll-off ratio ($\alpha$) of 0.5 and 0.25. FIG. 2B shows the impulse response waveforms (for ±3 symbol cycles) of a Nyquist filter and a route Nyquist filter both with roll-off ratio of 0.5. As understood from FIGS. 2A and 2B, the roll-off filter has a property that the center amplitude of an impulse response waveform is around 1 and 0 at the remaining symbol points. This property allows transmission of correct information while suppressing intersymbol interference for an input signal series. FIGS. 3A and 3B show the output waveforms and the difference (difference signal) of the amplitude value between the output waveforms obtained when total seven symbols of a binary signal series {−1, −1, −1, −1, +1, +1, +1} are respectively band-limited using the band limitation characteristics shown in FIGS. 2A and 2B. As understood from FIGS. 3A and 3B, an output waveform band-limited by either band limitation characteristic passes close to the amplitude value of a symbol value input at each symbol point. As a result, the difference signal obtained is much smaller than the amplitude value of each output waveform, even when the band limitation characteristic differs slightly.

The aforementioned roll-off filter may be implemented via a digital filter. Such a digital filter uses a plurality of digital adders so that the resulting circuit scale is larger. Thus, as means for implementing a digital filter via a small circuit scale, a configuration using a ROM (Read-only Memory) is generally used.

A roll-off filter using a ROM performs impulse response according to the band limitation characteristic and convolutional operation of an input signal series in advance, and stores the result in the ROM. The roll-off filter reads data (result of the convolutional operation) from the ROM in accordance with the input signal series and outputs the data as a band-limited signal. Since the operation result according to the band limitation characteristic is stored in the ROM, a plurality of ROMs must be provided in case a roll-off filter having a plurality of band limitation characteristics.

FIG. 9 is a block diagram showing an example of a related art waveform generator operable in accordance with a plurality of band limitation characteristics. In FIG. 9, the waveform generator is provided with a waveform generator 92 having a first band limitation characteristic and a waveform generator 93 having a secondhand limitation characteristic. In case the first band limitation characteristic is requested, the signal series input from an input terminal 91 is supplied to the waveform generator 92 via a selector switch 94. The output from the waveform generator 92 is output as a signal band-limited using the first band limitation characteristic via a selector switch 95 and an output terminal 96. In case the second band limitation characteristic is requested, the selector switches 94 and 95 are changed over. The signal series input from the input terminal 91 is supplied to the waveform generator 93 via the selector switch 94. The output from the waveform generator 93 is output as a signal band-limited using the second band limitation characteristic via the selector switch 95 and the output terminal 96.

FIG. 10 is a block diagram showing a specific exemplary configuration of the waveform generator shown in FIG. 9. This configuration example assumes that the band limitation characteristic, data interpolation ratio in arithmetic operation and bit accuracy of the operation result differ between the first band limitation filter and the second band limitation filter. In FIG. 10, the waveform generator 92 is composed of a counter 101a, an address generator 102a, a ROM 103a as a first band limitation filter, a D/A (digital-to-analog) converter 104a and a post-filter 105a. The waveform generator 93 is composed of a counter 101b, an address generator 102b, a ROM 103b as a second band limitation filter, a D/A (digital-to-analog) converter 104b and a post-filter 105b.

Next, operation assumed in case the first band limitation characteristic is requested will be described. A signal series having the symbol cycle T input from the input terminal 91 is supplied to a shift register 100 and sequentially shifted in accordance with a clock signal CLK1 (frequency of 1/T). To the address generator 102a are supplied an output from the shift register 100 via the selector switch 94 and an output from the counter 101a for counting a clock signal CLK2 (frequency obtained by multiplying CLK1 by a natural number) corresponding to the data interpolation ratio in the first band limitation characteristic. In the address generator 102a, address data is generated in accordance with an output from the shift register 100 and an output from the counter 101a, and the resulting address data is supplied to a ROM 103a. From the ROM 103a, waveform data stored therein is read in accordance with the supplied address data and output as n-bit digital data (n is a natural number). Accordingly, it is necessary to store waveform data (in nth power of 2) in the ROM 103a. To the D/A converter 104a having a resolution of n bits are supplied digital data from the ROM 103a and the clock signal CLK2. In the D/A converter 104a, digital data supplied from the ROM 103a is converted to an analog signal in the cycle of the clock signal CLK2, and the resulting analog signal is supplied to a post-filter 105a. In the post-filter 105a, an aliasing noise is removed from the supplied analog signal, and the resulting signal is output as a signal band-limited using a first band limitation characteristic via the selector switch 95 and the output terminal 96.

Next, operation assumed in case the second band limitation characteristic is requested will be described. In this case, the selector switches 94 and 95 are changed over. To the address generator 102a are supplied an output from the shift register 100 via the selector switch 94 and an output from the counter 100b for counting a clock signal CLK3 (frequency obtained by multiplying CLK1 by a natural number) corresponding to the data interpolation ratio in the secondhand limitation characteristic. In the address generator 102b, address data is generated in accordance with an output from the shift register 100 and an output from the counter 101b, and supplied to a ROM 103b. From the ROM 103b, waveform data stored therein is read in accordance with the supplied address data and output as m-bit digital data (m is a natural number). Accordingly, it is necessary to store waveform data (in mth power of 2) in the ROM 103b. To the D/A converter 104b having a resolution of m bits are supplied digital data from the ROM 103b and the clock signal CLK3. In the D/A converter 104b, digital data supplied from the ROM 103b is converted to an analog signal in the cycle of the clock signal CLK3, and the resulting analog signal is supplied to a post-filter 105b. In the post-filter 105b, an aliasing noise is removed from the supplied analog signal, and the resulting signal is output as a signal band-limited using a second band limitation characteristic via the selector switch 95 and the output terminal 96.

FIG. 11 is a block diagram showing another specific exemplary configuration of the waveform generator shown in FIG. 9. This configuration example assumes that the data interpolation ratio in arithmetic operation and bit accuracy of the operation result are identical between the first band limitation filter and the second band limitation filter. In FIG. 11, the waveform generator 92 is composed of a counter 101a, an address generator 102a, a ROM 103a as a first band limitation filter, a D/A converter 104a and a post-filter 105a. The waveform generator 93 is composed of a counter 101a, an address generator 102a, a ROM 103b as a second band limitation filter, a D/A converter 104a and a post-filter 105a. That is, the counter 101a, the address generator 102a, the D/A converter 104a and the post-filter 105a are common components of the waveform generators 92 and 93.

Next, operation assumed in case the first band limitation characteristic is requested will be described. The signal series having the symbol cycle T input from the input terminal 91 is supplied to a shift register 100 and sequentially shifted in accordance with a clock signal CLK1 (frequency of 1/T). To the address generator 102a are supplied an output from the shift register 100 via the selector switch 94 and an output from the counter 101a for counting a clock signal CLK2 (frequency obtained by multiplying CLK1 by a natural number) corresponding to the data interpolation ratio. In the address generator 102a, address data is generated in accordance with an output from the shift register 100 and an output from the counter 101a, and supplied to a ROM 103a via a selector switch 94. From the ROM 103a, waveform data stored therein is read in accordance with the supplied address data and output as n-bit digital data (n is a natural number). To the D/A converter 104a having a resolution of n bits are supplied digital data from the ROM 103a via the switch 95 and the clock signal CLK2. In the D/A converter 104a, digital data supplied from the ROM 103a is converted to an analog signal in the cycle of the clock signal CLK2, and the resulting analog signal is supplied to a post-filter 105a. In the post-filter 105a, an aliasing noise is removed from the supplied analog signal, and the resulting signal is output as a signal band-limited using a first band limitation characteristic via the output terminal 96.

Next, operation assumed in case the second band limitation characteristic is requested will be described. In this case, the selector switches 94 and 95 are changed over. Address data from the address generator 102a is supplied to a ROM 103b via the selector switch 94. From the ROM 103b, waveform data stored therein is read in accordance with the supplied address data and output as n-bit digital data. To the D/A converter 104b are supplied digital data from the ROM 103b via the selector switch 95 and the clock signal CLK2. In the D/A converter 104a, digital data supplied from the ROM 103b is converted to an analog signal in the cycle of the clock signal CLK2, and the resulting analog signal is supplied to a post-filter 105b. In the post-filter 105b, an aliasing noise is removed from the supplied analog signal, and the resulting signal is output as a signal band-limited using a second band limitation characteristic via the output terminal 96.

As mentioned earlier, in case the data interpolation ratio in arithmetic operation and bit accuracy of the operation result are identical and only the band limitation characteristic differs between the first band limitation filter and the second band limitation filter, by employing the configuration shown in FIG. 11, it is possible to slightly reduce the circuit scale compared with the circuit shown in FIG. 10. In any way, it is necessary to provide two band limitation filters. Even when such band limitation filters are implemented via ROMs, it is not possible to substantially reduce the circuit scale.

SUMMARY OF THE INVENTION

The invention has been proposed in view of the related art problems and aims at providing a waveform generator with smaller circuit scale operable in accordance with a plurality of band limitation characteristics.

In order to attain the aforementioned object, the first aspect of the invention is a waveform generator operable in accordance with a plurality of band limitation characteristics, in that the waveform generator comprises waveform generating means for generating a waveform signal band-limited using a first band limitation characteristic in accordance with the input signal series, memory means for storing in advance a difference signal between a waveform signal band-limited using the first band limitation characteristic for the input signal series and a waveform signal band-limited using a second band limitation characteristic for the input signal series and outputting the difference signal in accordance with the input signal series, adding means for adding a waveform signal from the waveform generating means to a difference signal from the memory means and outputting the signal band-limited using the second band limitation characteristic, and selector switch means for selectively outputting either a waveform signal from the waveform generating means or a waveform signal from the adding means.

The second aspect of the invention is a waveform generator operable in accordance with a plurality of band limitation characteristics, in that the waveform generator comprises first address generating means for generating address data in accordance with an input signal series, first memory means for storing in advance waveform data showing the result of band limitation using a first band limitation characteristic and outputting the waveform data in accordance with address data from the first address generating means, second address generating means for generating address data in accordance with the input signal series, second memory means for storing in advance difference data between waveform data showing the result of band limitation using the first band limitation characteristic and waveform data showing the result of band limitation using the second band limitation characteristic and outputting the difference data in accordance with address data from the second address generating means, digital adding means for adding waveform data from the first memory means to difference data from the second memory means and outputting waveform data showing the result of band limitation using the second band limitation characteristic, digital-to-analog conversion means for converting either waveform data from the first memory means or waveform data from the digital adding means to an analog signal, and filter means for removing an aliasing noise from the analog signal output from the digital-to-analog conversion means and outputting the resulting signal.

The third aspect of the invention is a waveform generator operable in accordance with a plurality of band limitation characteristics, in that the waveform generator comprises first address generating means for generating address data in accordance with an input signal series, first memory means for storing in advance waveform data showing the result of band limitation using a first band limitation characteristic and outputting the waveform data in accordance with address data from the first address generating means, first digital-to-analog conversion means for converting waveform data from the first memory means to an analog signal, second address generating means for generating address data in accordance with the input signal series, second memory means for storing in advance difference data between waveform data showing the result of band limitation using the first band limitation characteristic and waveform data showing the result of band limitation using the second band limitation characteristic and outputting the difference data in accordance with address data from the second address generating means, second digital-to-analog conversion means for converting difference data from the second memory means to an analog signal, analog adding means for adding an analog signal that is based on waveform data from the first digital-to-analog conversion means to an analog signal that is based on difference data from the second digital-to-analog conversion means and outputting an analog signal corresponding to the waveform data showing the result of band limitation using the second band limitation characteristic, and filter means for removing an aliasing noise from either an analog signal output from the first digital-to-analog conversion means or an analog signal from the analog adding means and outputting the resulting signal.

The fourth aspect of the invention is a waveform generator operable in accordance with a plurality of band limitation characteristics, in that the waveform generator comprises first address generating means for generating address data in accordance with an input signal series, first memory means for storing in advance, at a first data interpolation ratio, waveform data showing the result of band limitation using a first band limitation characteristic and outputting the waveform data in accordance with address data from the first address generating means, first digital-to-analog conversion means for converting waveform data from the first memory means to an analog signal in a first clock cycle corresponding to the first data interpolation ratio, second address generating means for generating address data in accordance with the input signal series, second memory means for storing in advance, at a second data interpolation ratio, difference data between waveform data showing the result of band limitation using the first band limitation characteristic and waveform data showing the result of band limitation using the second band limitation characteristic and outputting the difference data in accordance with address data from the second address generating means, second digital-to-analog conversion means for converting difference data from the second memory means to an analog signal in a first clock cycle corresponding to the second data interpolation ratio, analog adding means for adding an analog signal that is based on waveform data from the first digital-to-analog conversion means to an analog signal that is based on difference data from the second digital-to-analog conversion means and outputting an analog signal corresponding to the waveform data showing the result of band limitation using the second band limitation characteristic, first filter means for removing an aliasing noise from the analog signal output from the first digital-to-analog conversion means, second filter means for removing an aliasing noise from the analog signal output from the analog adding means, and selector switch means for selectively outputting either a signal from the first filter means or a signal from the second filter means.

The fifth aspect of the invention is a waveform generator operable in accordance with a plurality of band limitation characteristics, in that the waveform generator comprises first address generating means for generating address data in accordance with an input signal series, first memory means for storing in advance, at a first data interpolation ratio, waveform data showing the result of band limitation using a first band limitation characteristic and outputting the waveform data in accordance with address data from the first address generating means, second address generating means for generating address data in accordance with the input signal series, second memory means for storing in advance, at a second data interpolation ratio, difference data between waveform data showing the result of band limitation using the first band limitation characteristic and waveform data showing the result of band limitation using the second band limitation characteristic and outputting the difference data in accordance with address data from the second address generating means, interpolation filter means for converting a first data interpolation ratio for waveform data output from the first memory means, digital adding means for adding waveform data converted at the the data interpolation ratio from the interpolation filter means to difference data from the second memory means and outputting waveform data showing the result of band limitation using the second band limitation characteristic, digital-to-analog conversion means for converting either waveform data from the first memory means or waveform data from the digital adding means to an analog signal in the clock signal cycle corresponding to the data interpolation ratio, first filter means for removing an aliasing noise from the analog signal output from the digital-to-analog conversion means when the analog signal is based on the data of the first data interpolation ratio, second filter means for removing an aliasing noise from the analog signal output from the digital-to-analog conversion means when the analog signal is based on the data of the second data interpolation ratio, and selector switch means for selectively outputting either a signal from the first filter means or a signal from the second filter means.

The sixth aspect of the invention is a waveform generator for quadrature modulation operable in accordance with a plurality of band limitation characteristics, in that the waveform generator comprises serial-to-parallel conversion means for converting serial transmission data to parallel data, mapping means for converting parallel data from the serial-to-parallel conversion means to amplitude phase information and outputting the information as I-channel symbol data and Q-channel symbol data, first waveform generating means for generating a waveform signal band-limited using a first band limitation characteristic in accordance with I-channel symbol data from the mapping means, first memory means for storing in advance a difference signal between a waveform signal band-limited using the first band limitation characteristic for the I-channel symbol data and a waveform signal band-limited using a second band limitation characteristic fort he symbol data and outputting the difference signal in accordance with the symbol data, first adding means for adding a waveform signal from the first waveform generating means to a difference signal from the first memory means and outputting the waveform signal band-limited using the second band limitation characteristic, first selector switch means for selectively outputting either a waveform signal from the first waveform generating means or a waveform signal from the first adding means, second waveform generating means for generating a waveform signal band-limited using a first band limitation characteristic in accordance with I-channel symbol data from the mapping means, second memory means for storing in advance a difference signal between a waveform signal band-limited using the first band limitation characteristic for the Q-channel symbol data and a waveform signal band-limited using a second band limitation characteristic for the symbol data and outputting the difference signal in accordance with the symbol data, second adding means for adding a waveform signal from the second waveform generating means to a difference signal from the second memory means and outputting the waveform signal band-limited using the second band limitation characteristic, and second selector switch means for selectively outputting either a waveform signal from the second waveform generating means or a waveform signal from the second adding means.

DETAILED DESCRIPTION OF THE PREFERRED EMBODIMENTS

Figure 1:
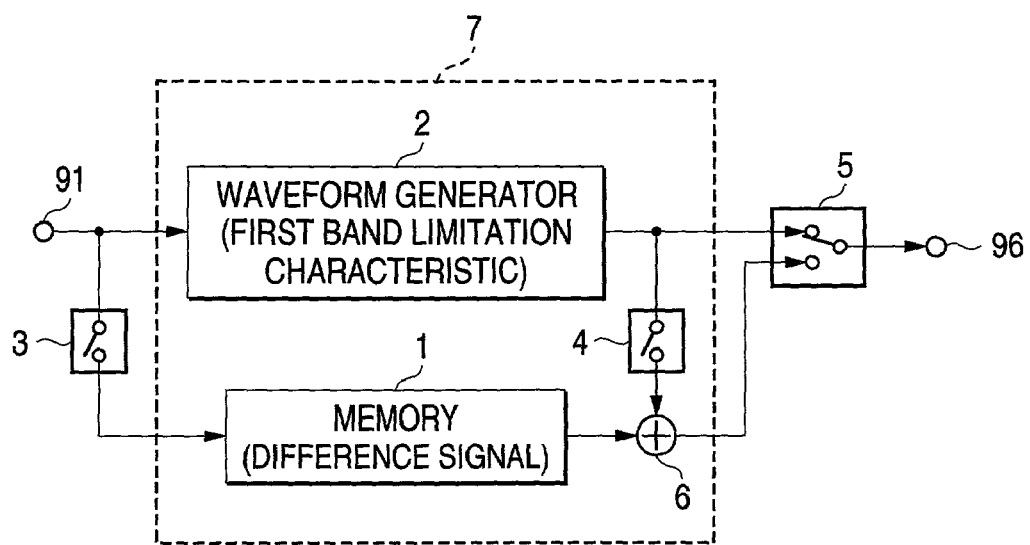
FIG. 1 is a block diagram showing the configuration of a waveform generator according to the first embodiment of the invention.
Figure 2:
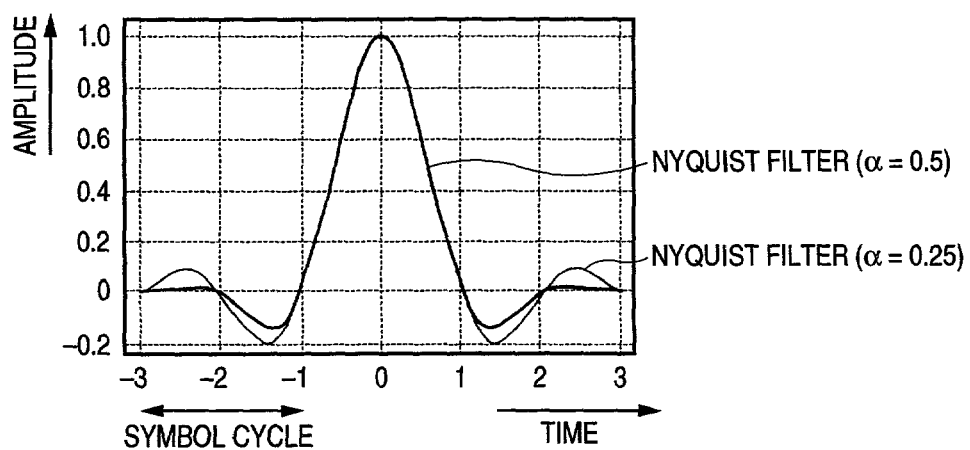
FIG. 2 is a waveform diagram showing the impulse response of a roll-off filter.
Figure 2:
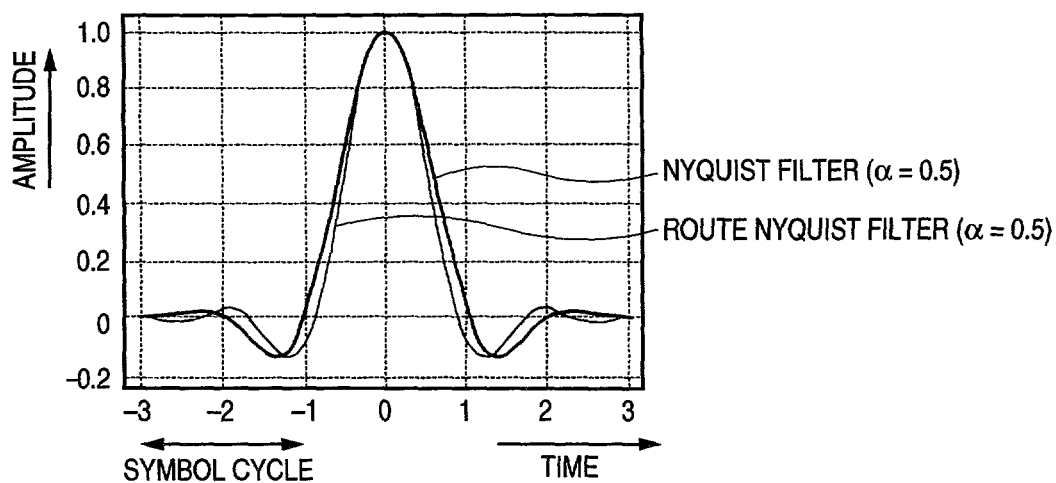

Embodiments of the invention will be detailed referring to the drawings.

(First Embodiment)

FIG. 1 is a block diagram showing the configuration of a waveform generator according to the first embodiment of the invention. In FIG. 1, an input terminal 91 where a signal series is input is connected to a waveform generator 2 having a first band limitation characteristic and memory 1 via a switch 3. The waveform generator 2 generates a waveform signal band-limited using the first band limitation characteristic in accordance with the supplied signal series. A difference signal between a waveform signal band-limited using the first band limitation characteristic for the supplied signal series and a waveform signal band-limited using a second band limitation characteristic for the signal series is obtained via arithmetic operation, and the resulting difference signal is stored in the memory 1. The waveform generator 2 is connected to one selection terminal of a selector switch 5 and an adder 6 via a switch 4. The memory 1 is connected to the adder 6. The adder 6 is connected to the other selection terminal of the selector switch 5. A selection terminal of the selector switch 5 is connected to an output terminal 96. The waveform generator 2, the memory 1, the switch 4, and the adder 6 constitutes a waveform generator 7 having the second band limitation characteristic.

Next, operation assumed in case the first band limitation characteristic is requested will be described. A signal series input from the input terminal 91 is supplied to the waveform generator 2. The waveform generator 2 generates a waveform signal band-limited using the first band limitation characteristic in accordance with the supplied signal series and outputs the signal from the output terminal 96 via the switch 5. The switches 3 and 4 are left open.

Next, operation assumed in case the second band limitation characteristic is requested will be described. In this case, the switches 3 and 4 are closed. The selector switch 5 is changed over to the selection terminal in the lower area of FIG. 1. A signal series input from the input terminal 91 is supplied to the waveform generator 2 and the memory 1 via the switch 3. The waveform generator 2 generates a waveform signal band-limited using the first band limitation characteristic in accordance with the supplied signal series and supplies the signal from the adder 6 via the switch 4. From the memory 1 is read a difference signal (a difference signal between a waveform signal band-limited using the first band limitation characteristic and a waveform signal band-limited using the second band limitation characteristic) stored in advance in accordance with the supplied signal series, and the difference signal is supplied to the adder 6. The adder 6 adds a waveform signal from the waveform generator 2 and a difference signal from the memory 1, and outputs the resulting waveform signal band-limited using the second band limitation characteristic from the output terminal 96 via the selector switch 5.

Figure 3:
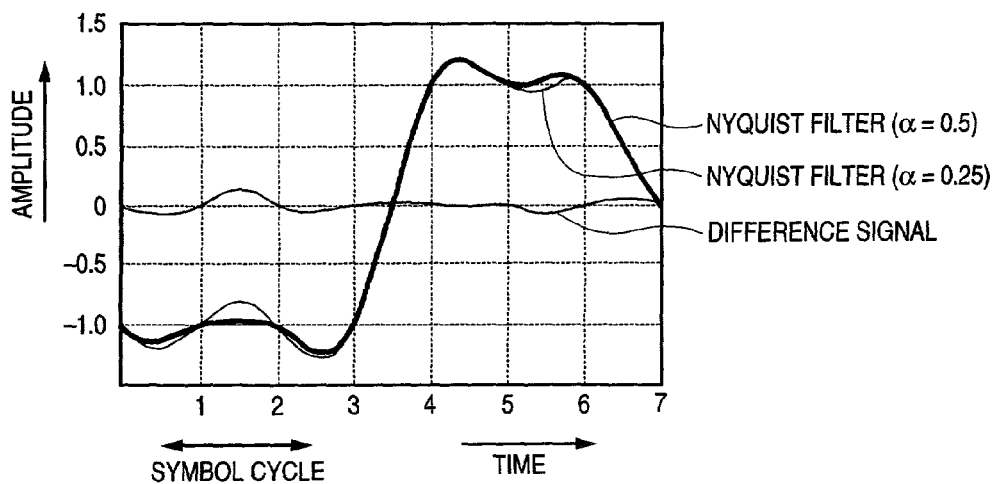
FIG. 3 is a waveform diagram showing the output of a roll-off filter in response to an input signal series.
Figure 3:
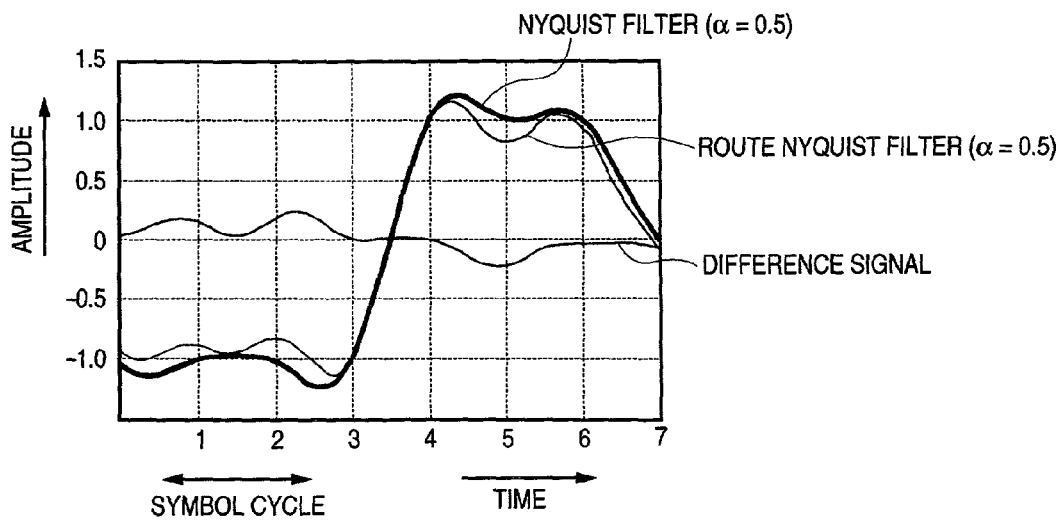

According to a waveform generator of this embodiment, as described referring to FIG. 3, a difference signal is much smaller than the amplitude value of the band-limited output waveform. It is thus possible to substantially reduce the capacity of the memory 1 compared with the case where a waveform signal corresponding to the second band limitation characteristic is stored, thereby implementing the same feature with a smaller circuit scale.

(Second Embodiment)

Figure 4:
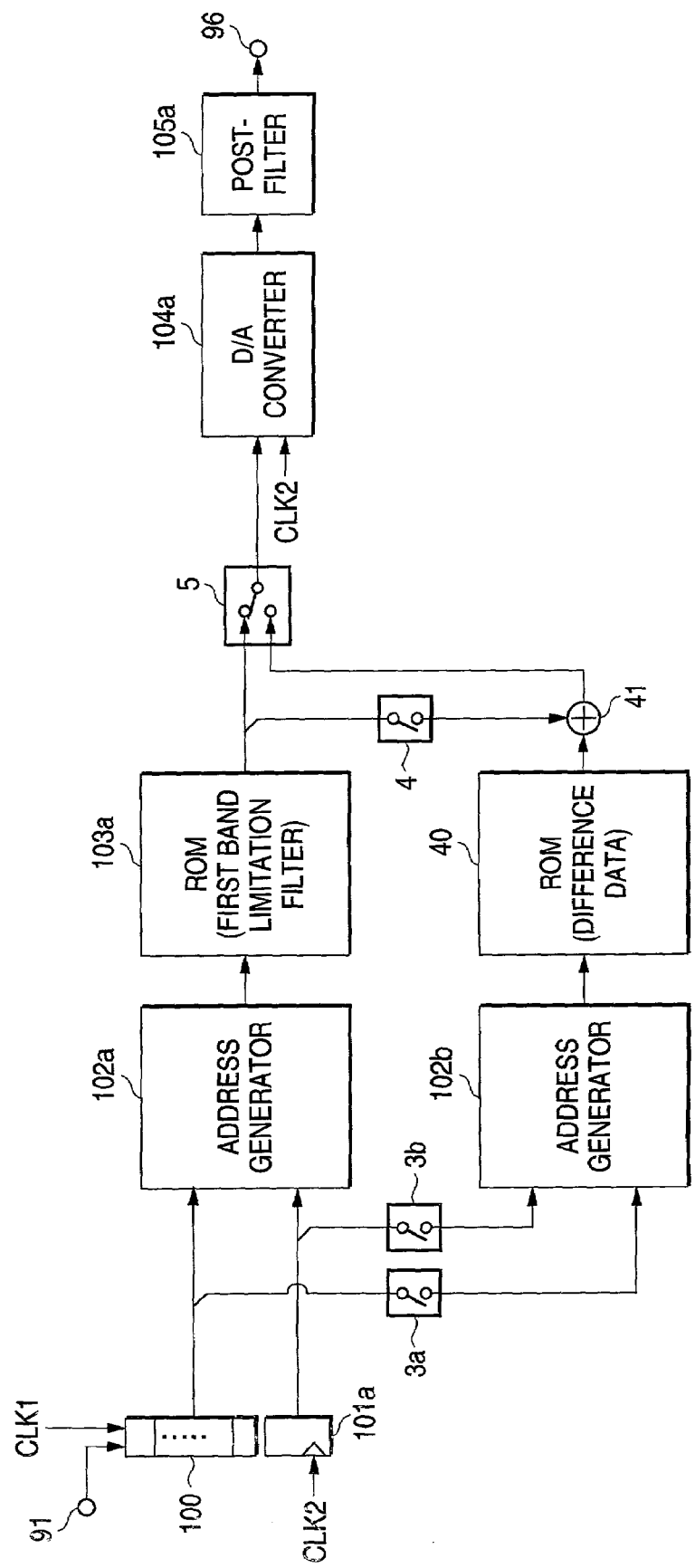
FIG. 4 is a block diagram showing the configuration of a waveform generator according to the second embodiment of the invention.

FIG. 4 is a block diagram showing the configuration of a waveform generator according to the second embodiment of the invention. In FIG. 4, an input terminal 91 where a signal series having the symbol cycle T is input is connected to a shift register 100. The shift register sequentially shifts the signal series having the symbol cycle T in accordance with a clock signal CLK1 (frequency of 1/T) The shift register 100 is connected to an address generator 102a and an address generator 102b via a switch 3a. A counter 101a for counting a clock signal CLK2 (frequency obtained by multiplying CLK1 by a natural number) corresponding to the data interpolation ratio in the first and second band limitation characteristics is connected to the address generator 102a and the address generator 102b via a switch 3b. The address generators 102a and 102b generate address data respectively in accordance with an output of the shift register 100 and an output of the counter 101a. The address generator 102a is connected to a ROM 103a as a first band limitation filter having a first band limitation characteristic. The ROM 103a stores waveform data showing the result of band limitation using the first band limitation characteristic with an accuracy of n bits (n is a natural number). The ROM 103a is connected to one selection terminal of a switch 5 and to a digital adder 41 via a switch 4. The address generator 102b is connected to a ROM 40. The ROM 40 stores difference data showing the result of band limitation using the first band limitation characteristic and waveform data showing the result of band limitation using the second band limitation characteristic with an accuracy of k bits (n is a natural number and k<<n). The ROM 40 is connected to a digital adder 41. The digital adder 41 is connected to the other selection terminal of the selector switch 5. A selection terminal of the selector switch 5 is connected to a D/A converter 104a for converting supplied digital data to an analog signal in the cycle of the clock signal CLK2. The D/A converter 104a is connected to a post-filter 105a for removing an aliasing noise. The post-filter 105a is connected to an output terminal 96.

Next, operation assumed in case the first band limitation characteristic is requested will be described. In this case, the address generator 102b, the ROM 40, and the digital adder 41 are not operational. A signal series having the symbol cycle T input from an input terminal 91 is supplied to the shift register 100 and sequentially shifted in accordance with the clock signal CLK1. To the address generator 102a are supplied an output from the shift register 100 and an output from the counter 101a for counting the clock signal CLK2. In the address generator 102a, address data is generated in accordance with an output from the shift register 100 and an output from the counter 101a, and the resulting address data is supplied to a ROM 103a. From the ROM 103a, waveform data stored therein is read in accordance with the supplied address data and output as n-bit digital data. The digital data is supplied to a D/A converter 104a via the selector switch 5. In the D/A converter 104a, supplied digital data is converted to an analog signal in the cycle of the clock signal CLK2, and the analog signal is supplied to the post-filter 105a. In the post-filter 105a, an aliasing noise is removed from the supplied analog signal and the resulting signal is output from the output terminal 96 as a signal band-limited using the first band limitation characteristic. The switches 3a, 3b and 4 are left open.

Next, operation assumed in case the second band limitation characteristic is requested will be described. In this case, the switches 3a, 3b and 4 are closed. The selector switch 5 is changed over to the selection terminal in the lower area of FIG. 4. A signal series having the symbol cycle T input from the input terminal 91 is supplied to the shift register 100 and sequentially shifted in accordance with the clock signal CLK1. To the address generator 102a are supplied an output from the shift register 100 and an output from the counter 101a for counting the clock signal CLK2. In the address generator 102a, address data is generated in accordance with an output from the shift register 100 and an output from the counter 101a, and the resulting address data is supplied to a ROM 103a. From the ROM 103a, waveform data stored therein is read in accordance with the supplied address data and output as n-bit digital data. The digital data is supplied to the digital adder 41. To the address generator 102b, an output from the shift register 100 is supplied via the switch 3a and an output from the counter 101a is supplied via the switch 3b. In the address generator 102b, address data is generated in accordance with an output from the shift register 100 and an output from the counter 101a, and the resulting address data is supplied to a ROM 40. From the ROM 40, difference data stored therein is read in accordance with the supplied address data and output as k-bit digital data. The digital data is supplied to the digital adder 41. The digital adder 41 adds waveform data from the ROM 103a to difference data from the ROM 40, and supplies the result of addition to the D/A converter 104a via the selector switch 5. In the D/A converter 104a, supplied addition result (digital data) is converted to an analog signal in the cycle of the clock signal CLK2, and the resulting analog signal is supplied to the post-filter 105b. In the post-filter 105b, an aliasing noise is removed from the supplied analog signal, and the resulting signal is output as a signal band-limited using the second band limitation characteristic via the output terminal 96.

According to a waveform generator of this embodiment, difference data is stored in the ROM 40. It is thus possible to substantially reduce the capacity of the ROM 40 compared with the case where waveform data corresponding to the second band limitation characteristic is stored, thereby implementing the same feature with a smaller circuit scale.

(Third Embodiment)

Figure 5:
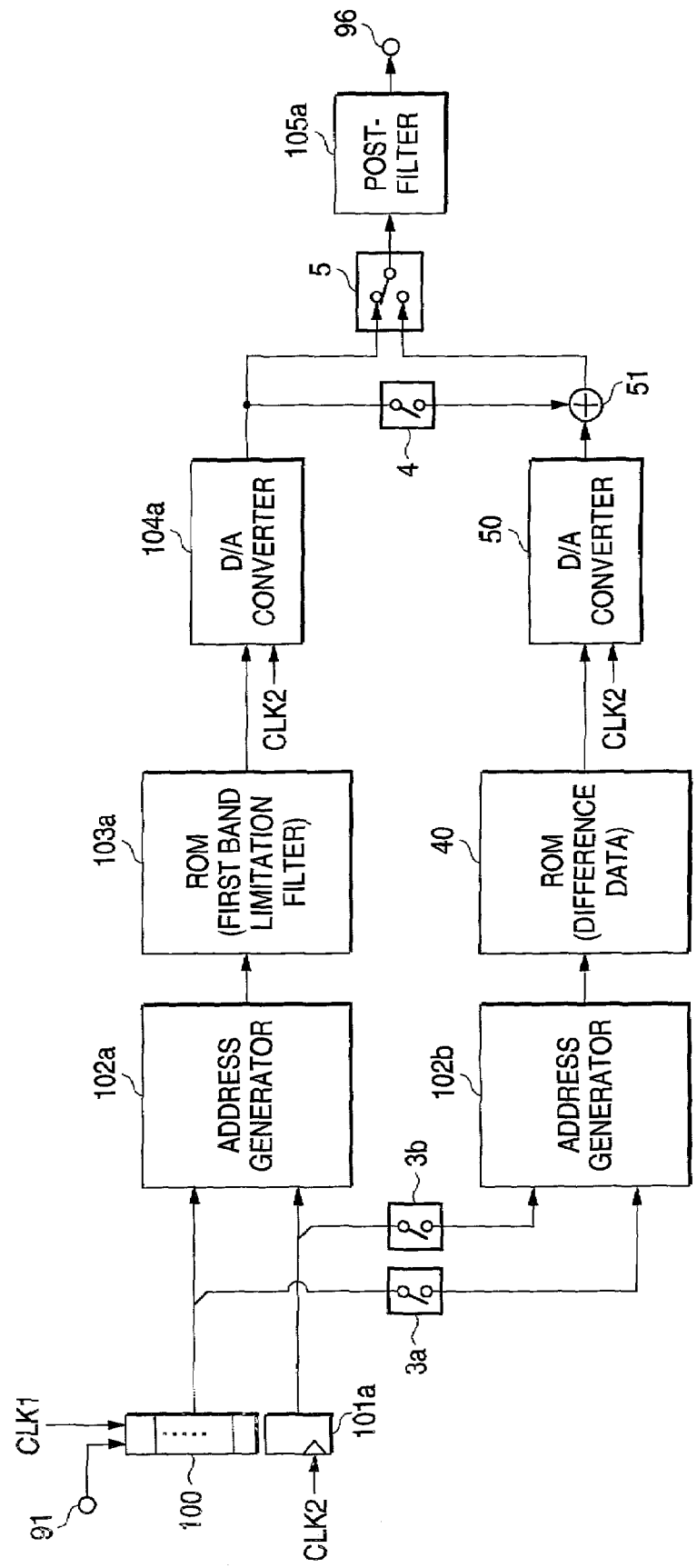
FIG. 5 is a block diagram showing the configuration of a waveform generator according to the third embodiment of the invention.

FIG. 5 is a block diagram showing the configuration of a waveform generator according to the third embodiment of the invention. In FIG. 5, an input terminal 91 where a signal series having the symbol cycle T is input is connected to a shift register 100. The shift register sequentially shifts the signal series having the symbol cycle T in accordance with a clock signal CLK1 (frequency of 1/T). The shift register 100 is connected to an address generator 102a and an address generator 102b via a switch 3a. A counter 101a for counting a clock signal CLK2 (frequency obtained by multiplying CLK1 by a natural number) corresponding to the data interpolation ratio in the first and second band limitation characteristics is connected to the address generator 102a and the address generator 102b via a switch 3b. The address generators 102a and 102b generate address data respectively in accordance with an output of the shift register 100 and an output of the counter 101a. The address generator 102a is connected to a ROM 103a as a first band limitation filter having a first band limitation characteristic. The ROM 103a stores waveform data showing the result of band limitation using the first band limitation characteristic with an accuracy of n bits (n is a natural number). The ROM 103a is connected to a D/A converter 104a for converting supplied digital data to an analog signal in the cycle of the clock signal CLK2. The D/A converter 104a is connected to one selection terminal of a selector switch 5 and an analog adder 51 via a switch 4. The address generator 102b is connected to a ROM 40. The ROM 40 stores difference data between waveform data showing the result of band limitation using the first band limitation characteristic and waveform data showing the result of band limitation using the second band limitation characteristic with an accuracy of k bits (n is a natural number and k<<n). The ROM 40 is connected to a D/A converter 50 for converting supplied digital data to an analog signal in the cycle of the clock signal CLK2. The D/A converter 50 is connected to the analog adder 51. The analog adder 51 is connected to the other selection terminal of the selector switch 5. A selection terminal of the selector switch 5 is connected to a post-filter 105a for removing an aliasing noise. The post-filter 105a is connected to an output terminal 96.

Next, operation assumed in case the first band limitation characteristic is requested will be described. In this case, the address generator 102b, the ROM 40, the D/A converter 50, and the analog adder 51 are not operational. A signal series having the symbol cycle T input from the input terminal 91 is supplied to the shift register 100 and sequentially shifted in accordance with the clock signal CLK1. To the address generator 102a are supplied an output from the shift register 100 and an output from the counter 101a for counting the clock signal CLK2. In the address generator 102a, address data is generated in accordance with an output from the shift register 100 and an output from the counter 101a, and the resulting address data is supplied to a ROM 103a. From the ROM 103a, waveform data stored therein is read in accordance with the supplied address data and output as n-bit digital data. The digital data is supplied to a D/A converter 104a. In the D/A converter 104a, supplied digital data is converted to an analog signal in the cycle of the clock signal CLK2, and the analog signal is supplied to the post-filter 105a via the selector switch 5. In the post-filter 105a, an aliasing noise is removed from the supplied analog signal and the resulting signal is output from the output terminal 96 as a signal band-limited using the first band limitation characteristic. The switches 3a, 3b and 4 are left open.

Next, operation assumed in case the second band limitation characteristic is requested will be described. In this case, the switches 3a, 3b and 4 are closed. The selector switch 5 is changed over to the selection terminal in the lower area of FIG. 5. A signal series having the symbol cycle T input from the input terminal 91 is supplied to the shift register 100 and sequentially shifted in accordance with the clock signal CLK1. To the address generator 102a are supplied an output from the shift register 100 and an output from the counter 101a for counting the clock signal CLK2. In the address generator 102a, address data is generated in accordance with an output from the shift register 100 and an output from the counter 101a, and the resulting address data is supplied to a ROM 103a. From the ROM 103a, waveform data stored therein is read in accordance with the supplied address data and output as n-bit digital data. The digital data is supplied to a D/A converter 104a. In the D/A converter 104a, supplied digital data is converted to an analog signal in the cycle of the clock signal CLK2, and the analog signal is supplied to the analog adder 51 via the switch 4. To the address generator 102b, an output from the shift register 100 is supplied via the switch 3a and an output from the counter 101a is supplied via the switch 3b. In the address generator 102b, address data is generated in accordance with an output from the shift register 100 and an output from the counter 101a, and the resulting address data is supplied to a ROM 40. From the ROM 40, difference data stored therein is read in accordance with the supplied address data and output as k-bit digital data. The digital data is supplied to the D/A converter 50. In the D/A converter 50, supplied digital data is converted to an analog signal in the cycle of the clock signal CLK2, and the resulting analog signal is supplied to the analog adder 51. The analog adder 51 adds an analog signal that is based on waveform data from the D/A converter 104a to an analog signal that is based on difference data from the D/A converter 50, and supplies the result of addition to the post-filter 105a. In the post-filter 105b, an aliasing noise is removed from the supplied analog signal, and the resulting signal is output as a signal band-limited using the second band limitation characteristic from the output terminal 96.

According to a waveform generator of this embodiment, difference data is stored in the ROM 40. It is thus possible to substantially reduce the capacity of the ROM 40 compared with the case where waveform data corresponding to the second band limitation characteristic is stored, thereby implementing the same feature with a smaller circuit scale.

According to a waveform generator of this embodiment, waveform data from the ROM 103a and difference data from the ROM 40 are respectively converted to an analog signal before addition of data. Thus it is possible to adjust the bit accuracy of difference data to be stored into the ROM 40 and the resolution of the D/A converter 50. Thus it is possible to reduce the resolution of the D/A converter 50 and reduce the circuit scale compared with the case where a waveform generator having the second band limitation characteristic is separately provided.

(Fourth Embodiment)

Figure 6:
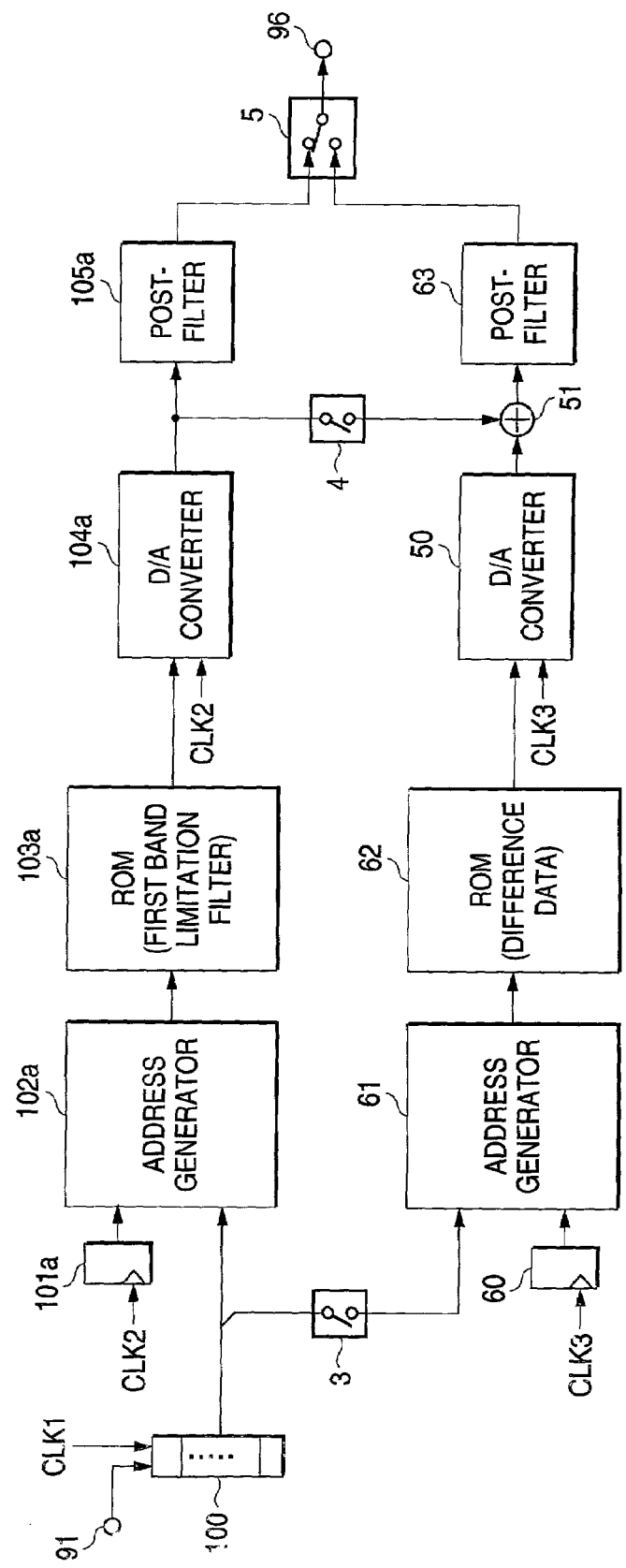
FIG. 6 is a block diagram showing the configuration of a waveform generator according to the fourth embodiment of the invention.

FIG. 6 is a block diagram showing the configuration of a waveform generator according to the fourth embodiment of the invention. In FIG. 6, an input terminal 91 where a signal series having the symbol cycle T is input is connected to a shift register 100. The shift register sequentially shifts the signal series having the symbol cycle T in accordance with a clock signal CLK1 (frequency of 1/T). The shift register 100 is connected to an address generator 102a and an address generator 61 via a switch 3. A counter 101a for counting a clock signal CLK2 (frequency obtained by multiplying CLK1 by a natural number) corresponding to the data interpolation ratio in the first band limitation characteristic is connected to the address generator 102a. The address generator 102a generates address data respectively in accordance with an output of the shift register 100 and an output of the counter 101a. The address generator 102a is connected to a ROM 103a as a first band limitation filter having a first band limitation characteristic. The ROM 103a stores waveform data showing the result of band limitation using the first band limitation characteristic with an accuracy of n bits (n is a natural number) at a data interpolation ratio corresponding to the clock signal CLK2. The ROM 103a is connected to a D/A converter 104a for converting supplied digital data to an analog signal in the cycle of the clock signal CLK2. The D/A converter 104a is connected to a post-filter 105a for removing an aliasing noise and an analog adder 51 via a switch 4. The post-filter 105a is connected to one selection terminal of a selector switch 5. A counter 60 for counting a clock signal CLK3 (frequency obtained by multiplying CLK1 by a natural number) corresponding to the data interpolation ratio in the second band limitation characteristic is connected to the address generator 61. The address generator 61 generates address data in accordance with an output of the shift register 100 and an output of the counter 60. The address generator 61 is connected to a ROM 62. The ROM 62 stores difference data between waveform data showing the result of band limitation using the first band limitation characteristic and waveform data showing the result of band limitation using the second band limitation characteristic with an accuracy of k bits (n is a natural number and k<<n) at a data interpolation ratio corresponding to the clock signal CLK3. The ROM 62 is connected to a D/A converter 50 for converting supplied digital data to an analog signal in the cycle of the clock signal CLK3. The D/A converter 50 is connected to the analog adder 51. The analog adder 51 is connected to a post-filter 63 for removing an aliasing noise. The post-filter 63 is connected to the other selection terminal of the selector switch 5. A selection terminal of the selector switch 5 is connected to an output terminal 96.

Next, operation assumed in case the first band limitation characteristic is requested will be described. In this case, the counter 60, the address generator 61, the ROM 62, the D/A converter 50, the analog adder 51, and the post-filter 63 are not operational. A signal series having the symbol cycle T input from the input terminal 91 is supplied to the shift register 100 and sequentially shifted in accordance with the clock signal CLK1. To the address generator 102a are supplied an output from the shift register 100 and an output from the counter 101a for counting the clock signal CLK2. In the address generator 102a, address data is generated in accordance with an output from the shift register 100 and an output from the counter 101a, and the resulting address data is supplied to a ROM 103a. From the ROM 103a, waveform data stored therein is read in accordance with the supplied address data and output as n-bit digital data. The digital data is supplied to a D/A converter 104a. In the D/A converter 104a, supplied digital data is converted to an analog signal in the cycle of the clock signal CLK2, and the analog signal is supplied to the post-filter 105a. In the post-filter 105a, an aliasing noise is removed from the supplied analog signal and the resulting signal is output from the output terminal 96 as a signal band-limited using the first band limitation characteristic via the selector switch 5. The switches 3 and 4 are left open.

Next, operation assumed in case the second band limitation characteristic is requested will be described. In this case, the switches 3 and 4 are closed. The selector switch 5 is changed over to the selection terminal in the lower area of FIG. 6. A signal series having the symbol cycle T input from the input terminal 91 is supplied to the shift register 100 and sequentially shifted in accordance with the clock signal CLK1. To the address generator 102a are supplied an output from the shift register 100 and an output from the counter 101a for counting the clock signal CLK2. In the address generator 102a, address data is generated in accordance with an output from the shift register 100 and an output from the counter 101a, and the resulting address data is supplied to a ROM 103a. From the ROM 103a, waveform data stored therein is read in accordance with the supplied address data and output as n-bit digital data. The digital data is supplied to a D/A converter 104a. In the D/A converter 104a, supplied digital data is converted to an analog signal in the cycle of the clock signal CLK2, and the analog signal is supplied to the analog adder 51 via the switch 4. To the address generator 61, an output from the shift register 100 is supplied via the switch 3 and an output from the counter 60 for counting the clock signal CLK3 is supplied. In the address generator 61, address data is generated in accordance with an output from the shift register 100 and an output from the counter 60, and the resulting address data is supplied to a ROM 62. From the ROM 62, difference data stored therein is read in accordance with the supplied address data and output as k-bit digital data. The digital data is supplied to the D/A converter 50. In the D/A converter 50, supplied digital data is converted to an analog signal in the cycle of the clock signal CLK3, and the resulting analog signal is supplied to the analog adder 51. The analog adder 51 adds an analog signal that is based on waveform data from the D/A converter 104a to an analog signal that is based on difference data from the D/A converter 50, and supplies the result of addition to the post-filter 63. In the post-filter 63, an aliasing noise is removed from the supplied analog signal, and the resulting signal is output as a signal band-limited using the second band limitation characteristic from the output terminal 96 via the selector switch 5.

According to a waveform generator of this embodiment, difference data is stored in the ROM 62. It is thus possible to substantially reduce the capacity of the ROM 62 compared with the case where waveform data corresponding to the second band limitation characteristic is stored, thereby implementing the same feature with a smaller circuit scale.

According to a waveform generator of this embodiment, waveform data from the ROM 103a and difference data from the ROM 62 are respectively converted to an analog signal before addition of data. Thus it is possible to adjust the bit accuracy of difference data to be stored into the ROM 62, the data interpolation ratio, the resolution of the D/A converter 50, and the input clock signal. Thus it is possible to reduce the resolution of the D/A converter 50 and reduce the circuit scale compared with the case where a waveform generator having the second band limitation characteristic is separately provided.

(Fifth Embodiment)

Figure 7:
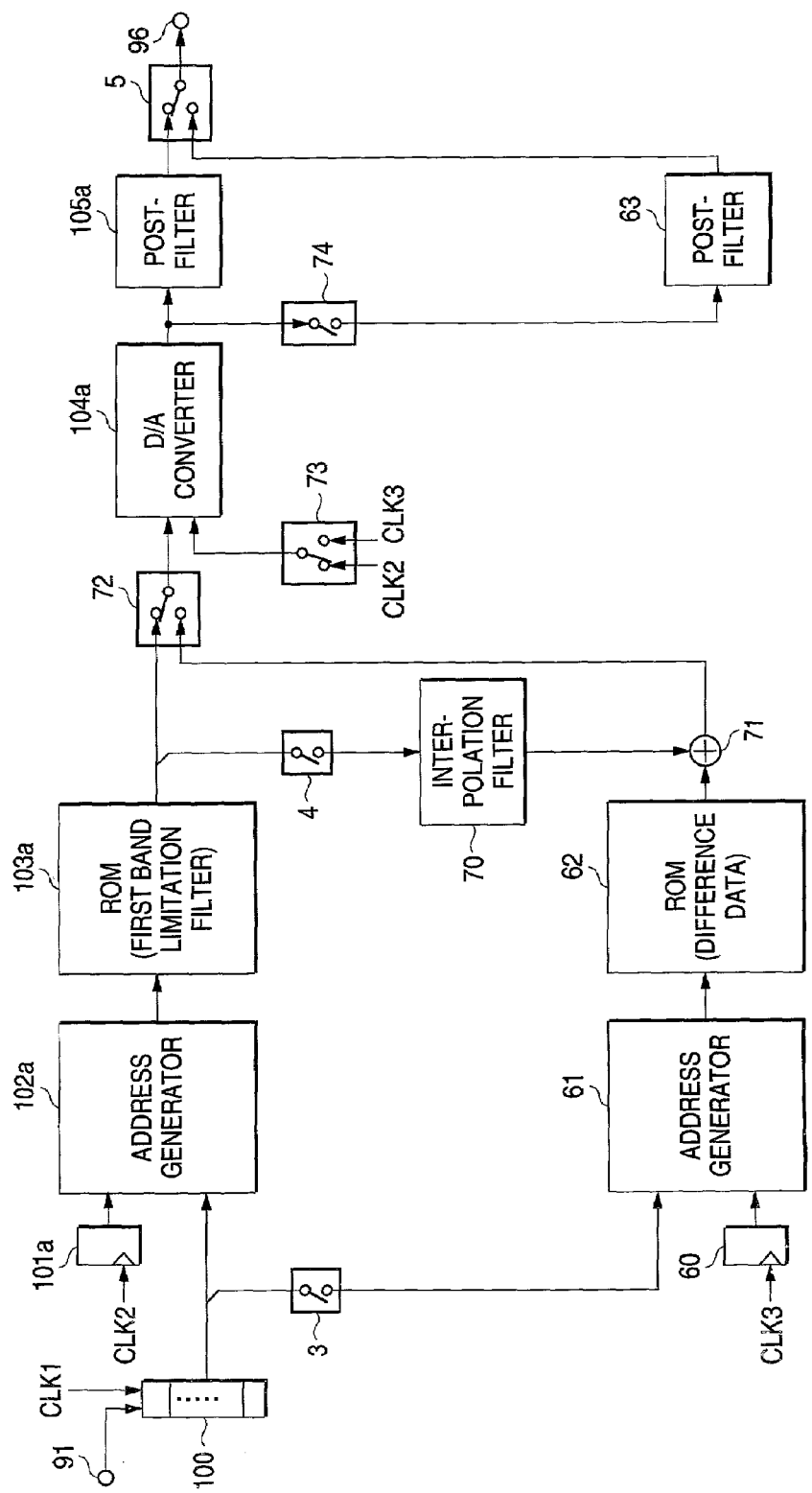
FIG. 7 is a block diagram showing the configuration of a waveform generator according to the fifth embodiment of the invention.

FIG. 7 is a block diagram showing the configuration of a waveform generator according to the fifth embodiment of the invention. In FIG. 7, an input terminal 91 where a signal series having the symbol cycle T is input is connected to a shift register 100. The shift register sequentially shifts the signal series having the symbol cycle T in accordance with a clock signal CLK1 (frequency of 1/T). The shift register 100 is connected to an address generator 102a and an address generator 61 via a switch 3. A counter 101a for counting a clock signal CLK2 (frequency obtained by multiplying CLK1 by a natural number) corresponding to the data interpolation ratio in the first band limitation characteristic is connected to the address generator 102a. The address generator 102a generates address data respectively in accordance with an output of the shift register 100 and an output of the counter 101a. The address generator 102a is connected to a ROM 103a as a first band limitation filter having a first band limitation characteristic. The ROM 103a stores waveform data showing the result of band limitation using the first band limitation characteristic with an accuracy of n bits (n is a natural number) at a data interpolation ratio corresponding to the clock signal CLK2. The ROM 103a is connected to one selection terminal of a selector switch 72 and an interpolation filter via a switch 4. The interpolation filter 70 converts a data interpolation ratio corresponding to the clock signal CLK2 for waveform data output from the ROM 103a to a data interpolation ratio corresponding to the clock signal CLK3. The interpolation filter 70 is connected to a digital adder 71. A counter 60 for counting a clock signal CLK3 (frequency obtained by multiplying CLK1 by a natural number) corresponding to the data interpolation ratio in the second band limitation characteristic is connected to the address generator 61. The address generator 61 generates address data in accordance with an output of the shift register 100 and an output of the counter 60. The address generator 61 is connected to a ROM 62. The ROM 62 stores difference data between waveform data showing the result of band limitation using the first band limitation characteristic and waveform data showing the result of band limitation using the second band limitation characteristic with an accuracy of k bits (n is a natural number and k<<n) at a data interpolation ratio corresponding to the clock signal CLK3. The ROM 62 is connected to the digital adder 71. The digital adder 71 is connected to the other selection terminal of the selector switch 72. A selection terminal of the selector switch 72 is connected to a D/A converter 104a. To the D/A converter 104a is connected a selector switch 73 for supplying either the clock signal CLK2 or clock signal CLK3 to the D/A converter 104a. The D/A converter 104a converts supplied data to an analog signal in the cycle of the clock signal from the selector switch 73. The D/A converter 104a is connected to a post-filter 105a for removing an aliasing noise generated at a data interpolation ratio corresponding to the clock signal CLK2 and a post-filter 63 for removing an aliasing noise generated at a data interpolation ratio corresponding to the clock signal CLK3, via a switch 74. The post-filter 105a is connected to one selection terminal of the selector switch 5 and the post-filter 63 is connected to the other selection terminal of the selector switch 5. A selection terminal of the selector switch 5 is connected to an output terminal 96.

Next, operation assumed in case the first band limitation characteristic is requested will be described. In this case, the counter 60, the address generator 61, the ROM 62, the interpolation filter 70, the digital adder 71, and the post-filter 63 are not operational. A signal series having the symbol cycle T input from the input terminal 91 is supplied to the shift register 100 and sequentially shifted in accordance with the clock signal CLK1. To the address generator 102a are supplied an output from the shift register 100 and an output from the counter 101a for counting the clock signal CLK2. In the address generator 102a, address data is generated in accordance with an output from the shift register 100 and an output from the counter 101a, and the resulting address data is supplied to a ROM 103a. From the ROM 103a, waveform data stored therein is read in accordance with the supplied address data and output as n-bit digital data. The digital data is supplied to a D/A converter 104a via a selector switch 72. In the D/A converter 104a, supplied digital data is converted to an analog signal in the cycle of the clock signal CLK2 from a selector switch 73, and the analog signal is supplied to the post-filter 105a. In the post-filter 105a, an aliasing noise is removed from the supplied analog signal and the resulting signal is output from the output terminal 96 as a signal band-limited using the first band limitation characteristic via the selector switch 5. The switches 3, 4 and 74 are left open.

Next, operation assumed in case the second band limitation characteristic is requested will be described. In this case, the switches 3, 4 and 74 are closed. The selector switch 72 is changed over to the selection terminal in the right area of FIG. 7. The selector switch 73 is changed over to the selection terminal in the lower area of FIG. 7. A signal series having the symbol cycle T input from the input terminal 91 is supplied to the shift register 100 and sequentially shifted in accordance with the clock signal CLK1. To the address generator 102a are supplied an output from the shift register 100 and an output from the counter 101a for counting the clock signal CLK2. In the address generator 102a, address data is generated in accordance with an output from the shift register 100 and an output from the counter 101a, and the resulting address data is supplied to a ROM 103a. From the ROM 103a, waveform data stored therein is read in accordance with the supplied address data and output as n-bit digital data. The digital data is supplied to an interpolation filter 70 and a data interpolation ratio corresponding to the clock signal CLK2 is converted to a data interpolation ratio corresponding to the clock signal CLK3. The data with its data interpolation ratio converted is supplied to a digital adder 71. To the address generator 61, an output from the shift register 100 is supplied via the switch 3 and an output from the counter 60 for counting the clock signal CLK3 is supplied. In the address generator 61, address data is generated in accordance with an output from the shift register 100 and an output from the counter 60, and the resulting address data is supplied to a ROM 62. From the ROM 62, difference data stored therein is read in accordance with the supplied address data and output as k-bit digital data. The digital data is supplied to the digital adder 71. The digital adder 71 adds waveform data from the interpolation filter 70 with its data interpolation ratio converted to difference data from the ROM 62, and supplies the addition result to a D/A converter 104a via the selector switch 72. In the D/A converter 104a, supplied addition result (digital data) is converted to an analog signal in the cycle of the clock signal CLK3 from the selector switch 73, and the resulting analog signal is supplied to a post-filter 63 via the switch 74. In the post-filter 63, an aliasing noise is removed from the supplied analog signal, and the resulting signal is output as a signal band-limited using the second band limitation characteristic from the output terminal 96 via the switch 5.

According to a waveform generator of this embodiment, difference data is stored in the ROM 62. It is thus possible to substantially reduce the capacity of the ROM 62 compared with the case where waveform data corresponding to the second band limitation characteristic is stored, thereby implementing the same feature with a smaller circuit scale.

According to a waveform generator of this embodiment, it is possible to share the D/A converter 104a by inserting the interpolation filter 70, thus reducing the circuit scale compared with the case where a waveform generator having the second band limitation characteristic is separately provided.

In this embodiment, an interpolation filter 70 is provided to convert a data interpolation ratio corresponding to the clock signal CLK2 to a data interpolation ratio corresponding to the clock signal CLK3 for waveform data output from the ROM 103a. Instead of this configuration, it is possible to provide an interpolation filter to convert a data interpolation ratio corresponding to the clock signal CLK3 to a data interpolation ratio corresponding to the clock signal CLK2 for difference data output from the ROM 62.

(Sixth Embodiment)

Figure 8:
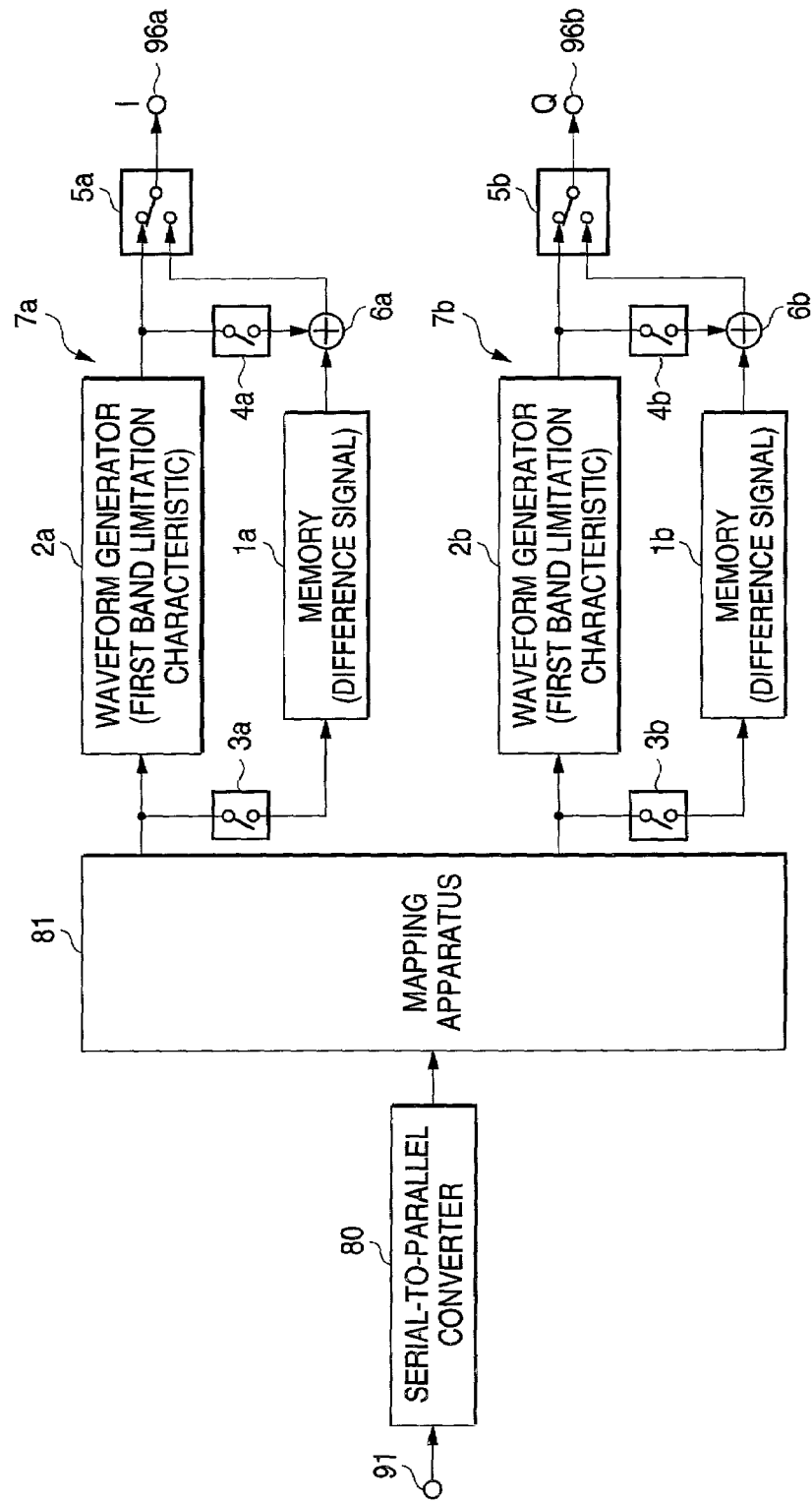
FIG. 8 is a block diagram showing the configuration of a waveform generator for quadrature modulation according to the eighth embodiment of the invention.
Figure 9:
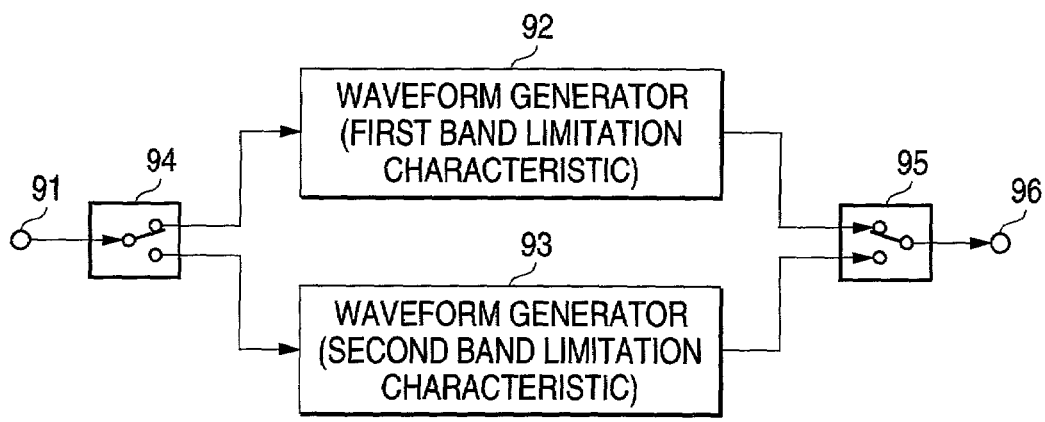
FIG. 9 is a block diagram showing an example of a related art waveform generator.
Figure 10:
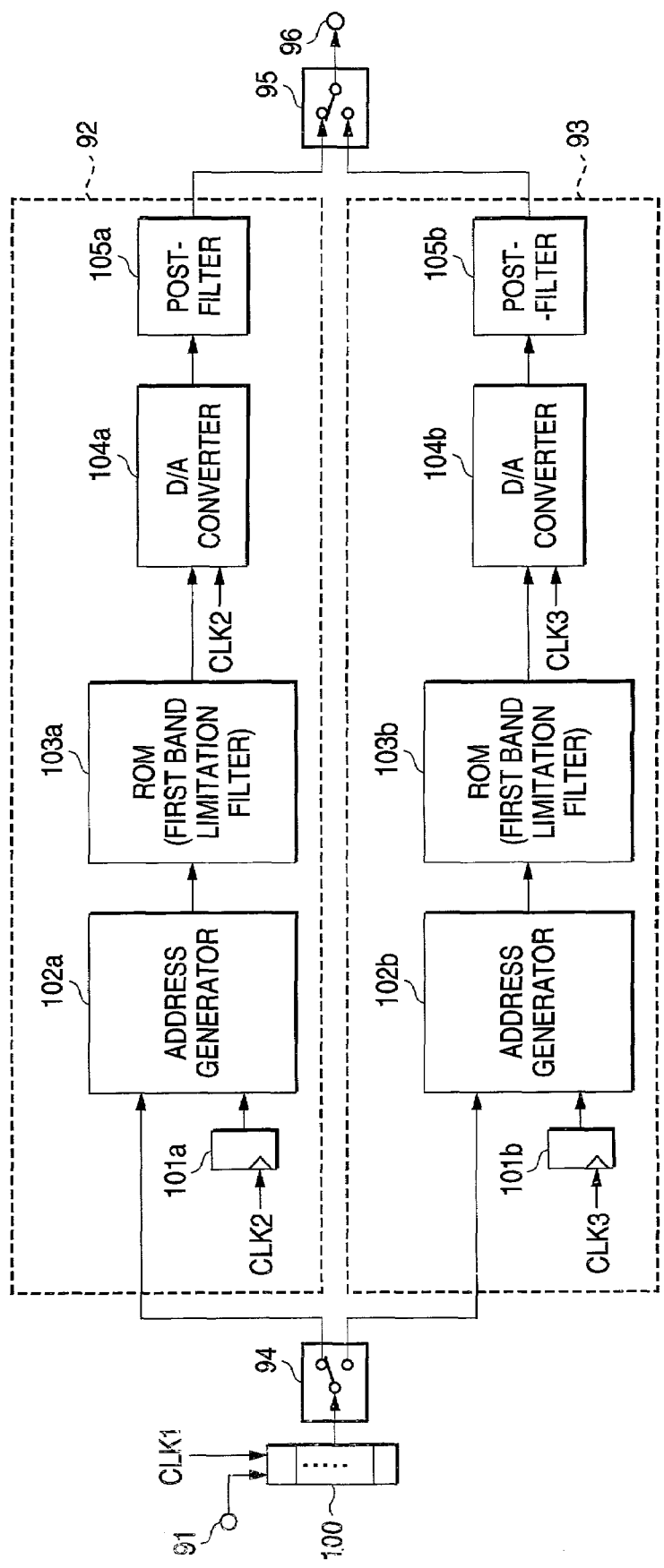
FIG. 10 is a block diagram showing a specific exemplary configuration of the waveform generator shown in FIG. 9.
Figure 11:
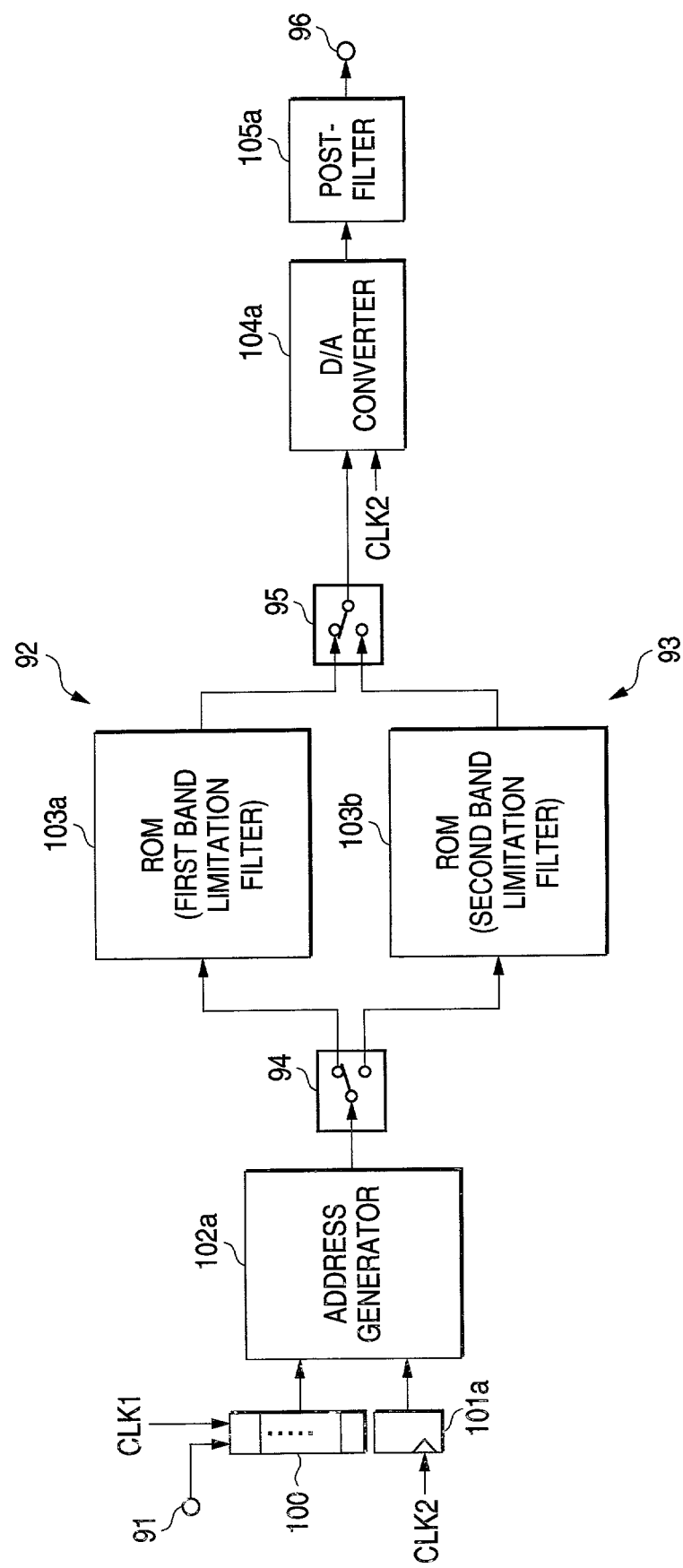
FIG. 11 is a block diagram showing another specific exemplary configuration of the waveform generator shown in FIG. 9.

FIG. 8 is a block diagram showing the configuration of a waveform generator for quadrature modulation according to the sixth embodiment of the invention. In FIG. 8, an input terminal 91 where serial transmission data is input is connected to a serial-to-parallel converter 80 for converting the serial transmission data to parallel data. The serial-to-parallel converter 80 is connected to mapping apparatus 81. The mapping apparatus 81 converts parallel data from the serial-to-parallel converter 80 amplitude phase information and output the information as I-channel symbol data and Q-channel symbol data. The mapping apparatus 81 is connected to a waveform generator 2a having a first band limitation characteristic and memory 1a via a switch 3a. The waveform generator 2a generates a waveform signal band-limited using the first band limitation characteristic in accordance with supplied I-channel symbol data. A difference signal between a waveform signal band-limited using the first band limitation characteristic for the I-channel symbol data and a waveform signal band-limited using a second band limitation characteristic for the symbol data is obtained via arithmetic operation, and the resulting difference signal is stored in the memory 1a. The waveform generator 2a is connected to one selection terminal of a selector switch 5a and an adder 6a via a switch 4a. The memory 1a is connected to the adder 6a. The adder 6a is connected to the other selection terminal of the selector switch 5a. A selection terminal of the selector switch 5a is connected to an output terminal 96a. The waveform generator 2a, the memory 1a, the switch 4a, and the adder 6a constitutes a waveform generator 7a having a second band limitation characteristic. The mapping apparatus 81 is connected to a waveform generator 2b having the first band limitation characteristic and memory 1b via a switch 3b. The waveform generator 2b generates a waveform signal band-limited using the first band limitation characteristic in accordance with supplied Q-channel symbol data. A difference signal between a waveform signal band-limited using the first band limitation characteristic for the Q-channel symbol data and a waveform signal band-limited using a second band limitation characteristic for the symbol data is obtained via arithmetic operation, and the resulting difference signal is stored in the memory 1b. The waveform generator 2b is connected to one selection terminal of a selector switch 5b and an adder 6b via a switch 4b. The memory 1b is connected to the adder 6b. The adder 6b is connected to the other selection terminal of the selector switch 5b. A selection terminal of the selector switch 5b is connected to an output terminal 96b. The waveform generator 2b, the memory 1b, the switch 4b, and the adder 6b constitutes a waveform generator 7b having a second band limitation characteristic.

Next, operation assumed in case the first band limitation characteristic is requested will be described. In this case, memory 1a, 1b and the adders 6a, 6b are not operational. Serial transmission data input from the input terminal 91 is supplied to the serial-to-parallel converter 80. In the serial-to-parallel converter 80, supplied serial transmission data is converted to parallel data, which is supplied to the mapping apparatus 81. In the mapping apparatus 81, supplied parallel data is converted to amplitude phase information, which is output as I-channel symbol data and Q-channel symbol data. I-channel symbol data is supplied to the waveform generator 2a. In the waveform generator 2a, a waveform signal band-limited using the first band limitation characteristic is generated in accordance with the supplied I-channel symbol data and output from the output terminal 96a via the selector switch 5a. Q-channel symbol data from the mapping apparatus 81 is supplied to the waveform generator 2b. In the waveform generator 2b, a waveform signal band-limited using the first band limitation characteristic is generated in accordance with the supplied Q-channel symbol data and output from the output terminal 96b via the selector switch 5b. The switches 3a, 3b and 4a, 4b are left open.

Next, operation assumed in case the second band limitation characteristic is requested will be described. In this case, the switches 3a, 3b and 4a, 4b are closed. The selector switches 5a, 5b are respectively changed over to the selection terminals in the lower area of FIG. 8. In the serial-to-parallel converter 80, supplied serial transmission data is converted to parallel data, which is supplied to the mapping apparatus 81. In the mapping apparatus 81, supplied parallel data is converted to amplitude phase information, which is output as I-channel symbol data and Q-channel symbol data. I-channel symbol data is supplied to the waveform generator 2a and the memory 1a via the switch 3a. In the waveform generator 2a, a waveform signal band-limited using the first band limitation characteristic is generated in accordance with the supplied I-channel symbol data and the waveform signal is supplied to the adder 6a via the switch 4a. From the memory 1a is read a stored difference signal in accordance with the supplied I-channel symbol data, and the difference signal is supplied to the adder 6a. The adder 6a adds the waveform signal from the waveform generator 2a to the difference signal from the memory 1a. The resulting waveform signal band-limited using the second band limitation characteristic is output from the output terminal 96a via the selector switch 5a. Q-channel symbol data from the mapping apparatus 81 is supplied to the waveform generator 2b and the memory 1b via the switch 3b. In the waveform generator 2b, a waveform signal band-limited using the first band limitation characteristic is generated in accordance with the supplied Q-channel symbol data and the waveform signal is supplied to the adder 6b via the switch 4b. From the memory 1a is read a stored difference signal in accordance with the supplied Q-channel symbol data, and the difference signal is supplied to the adder 6b. The adder 6b adds the waveform signal from the waveform generator 2b to the difference signal from the memory 1b. The resulting waveform signal band-limited using the second band limitation characteristic is output from the output terminal 96b via the selector switch 5b.

According to a waveform generator for quadrature modulation of this embodiment, a difference signal is stored in the memory 1a, 1a. It is thus possible to substantially reduce the capacity of the memory 1a, 1a compared with the case where a waveform signal corresponding to the second band limitation characteristic is stored, thereby implementing the same feature with a smaller circuit scale.

In the configuration of this embodiment, it is possible to use an I-channel waveform generator and a Q-channel waveform generator on a time-division basis.

As understood from the foregoing description, according to the invention, a difference signal (difference data) to be stored in memory means is much smaller than the amplitude value of an output waveform. It is thus possible to substantially reduce the capacity of the memory means compared with the case where a waveform signal (waveform data) corresponding to the second band limitation characteristic is stored, thereby making it possible to implement a waveform generator operable in accordance with a plurality of band limitation characteristics with a smaller circuit scale.

What is claimed is:

1. A waveform generator for quadrature modulation operable in accordance with a plurality of band limitation characteristics, comprising:

serial-to-parallel conversion means for converting serial transmission data to parallel data;

mapping means for converting parallel data from said serial-to-parallel conversion means to amplitude-phase information and outputting the information as I-channel symbol data and Q-channel symbol data;

first waveform generating means for generating a waveform signal band-limited using a first band limitation characteristic in accordance with said I-channel symbol data from said mapping means;

first memory means for storing in advance a difference signal between a waveform signal band-limited using the first band limitation characteristic for said I-channel symbol data and a waveform signal band-limited using a second band limitation characteristic for said I-channel symbol data and outputting said difference signal in accordance with said I-channel symbol data;

first adding means for adding the waveform signal from said first waveform generating means to the difference signal from said first memory means and outputting the waveform signal band-limited using the second band limitation characteristic for said I-channel symbol data;

first selector switch means for selectively outputting either the waveform signal from said first waveform generating means or the waveform signal from said first adding means;

second waveform generating means for generating a waveform signal band-limited using a first band limitation characteristic in accordance with Q-channel symbol data from said mapping means;

second memory means for storing in advance a difference signal between a waveform signal band-limited using the first band limitation characteristic for said Q-channel symbol data and a waveform signal band-limited using a second band limitation characteristic for said Q-channel symbol data and outputting said difference signal in accordance with said symbol data;

second adding means for adding the waveform signal from said second waveform generating means to said difference signal from said second memory means and outputting the waveform signal band-limited using the second band limitation characteristic for said Q-channel symbol data; and second selector switch means for selectively outputting either the waveform signal from said second waveform generating means or the waveform signal from said second adding means.

* * * * *